US006629280B1

(12) United States Patent
Koprowski et al.

(10) Patent No.: US 6,629,280 B1
(45) Date of Patent: Sep. 30, 2003

(54) METHOD AND APPARATUS FOR DELAYING ABIST START

(75) Inventors: Timothy J. Koprowski, Newburgh, NY (US); William V. Huott, Holmes, NY (US); Timothy G. McNamara, Fishkill, NY (US); Pradip Patel, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 302 days.

(21) Appl. No.: 09/669,462

(22) Filed: Sep. 25, 2000

(51) Int. Cl.[7] .......................... G01B 31/28; G01B 31/02

(52) U.S. Cl. ....................................... 714/733; 324/763

(58) Field of Search ................................ 714/724, 733; 324/763

(56) References Cited

U.S. PATENT DOCUMENTS

| | | | | | |
|---|---|---|---|---|---|
| 5,673,273 | A | * | 9/1997 | Almy | 714/724 |
| 5,740,412 | A | * | 4/1998 | Chan et al. | 713/600 |
| 5,912,901 | A | * | 6/1999 | Adams et al. | 714/733 |
| 5,925,144 | A | | 7/1999 | Sebaa | 714/733 |
| 5,930,270 | A | | 7/1999 | Forlenza et al. | 371/25.1 |
| 5,938,784 | A | | 8/1999 | Kim | 714/733 |
| 5,982,189 | A | * | 11/1999 | Motika et al. | 324/763 |
| 5,983,009 | A | | 11/1999 | Lepejian et al. | 395/500.19 |
| 5,983,380 | A | | 11/1999 | Motika et al. | 714/733 |
| 6,012,157 | A | | 1/2000 | Lu | 714/741 |
| 6,021,514 | A | | 2/2000 | Koprowski | 714/733 |
| 6,073,258 | A | * | 6/2000 | Wheater | 714/718 |
| 6,330,681 | B1 | * | 12/2001 | Cote et al. | 713/322 |
| 6,393,594 | B1 | * | 5/2002 | Anderson et al. | 714/738 |
| 6,427,217 | B1 | * | 7/2002 | Hartnett | 714/733 |

OTHER PUBLICATIONS

"Maximization of Self–Test Coverage in a Hardware Design", IBM Technical Disclosure Bulletin, vol. 35 No. 1A, Jun. 1992.

* cited by examiner

*Primary Examiner*—Albert Decady
*Assistant Examiner*—Anthony T. Whittington
(74) *Attorney, Agent, or Firm*—Lynn Augspurger; Cantor Colburn LLP

(57) ABSTRACT

An exemplary embodiment of the invention is a method and apparatus for delaying the start of an array built-in self-test (ABIST) until after the ABIST memory arrays have been started. The length of the delay is determined by the value in a programmable delay located on the integrated circuit. The initiation of the ABIST test is delayed by the time specified in the programmable delay.

6 Claims, 2 Drawing Sheets

METHOD AND APPARATUS FOR DELAYING ABIST START

FIELD OF THE INVENTION

The invention relates to testing integrated circuits, and, more particularly, to a method and apparatus for programmably delaying the start of an array built-in self-test (ABIST) until the ABIST memory arrays have been started and the power supply voltage on the integrated circuit has stabilized.

BACKGROUND OF THE INVENTION

Array built-in self-test (ABIST) is used to test the memory arrays that are contained in high-end processors. ABIST allows the memory arrays to be tested at and above system clock speeds using a locally generated pattern set that verifies memory array functionality.

Conceptually, the ABIST approach is based on the realization that much of a circuit tester's electronics is semiconductor based, just like the products it is testing, and that many of the challenges and limitations in testing lie in the interface to the Device Under Test (DUT). The ABIST approach can be described as an attempt to move many of the already semiconductor-based test equipment functions into the products under test and eliminate the complex interfacing. One of the major advantages ABIST has over other means of testing memory arrays is that the operation of the test is self-contained. All of the circuitry required to execute the test at-speed is contained within the integrated circuit. Very limited external controls are needed, so ABIST can be run at all levels of packaging (wafer, TCA, module and system) without requiring expensive external test equipment.

ABIST utilizes a boundary-scan design-for-test (DFT) technique. The DFT technique consists of placing a scannable memory element, or boundary-scan chain, adjacent to each integrated circuit I/O so that signals at the integrated circuit boundaries can be controlled and observed using scan operations and without direct contact with the integrated circuit. All internal storage elements are modified such that in test mode they form individual stages of a shift register for scanning in test data stimuli and scanning out test responses. Execution of finite-state-machine ABIST involves initializing the integrated circuit for ABIST, usually through the scannable memory element, and applying a sufficient number of system clocks, either externally or through a self-generated clock, for the finite-state machine to reach its final state.

In contrast, execution of programmable ABIST involves scanning the ABIST program to be applied into a custom microcode array, and each instruction is decoded, executed, and applied to the array by the ABIST microprocessor. During the programmable ABIST test, a controller based on a programmable-state machine is used to algorithmically generate a variety of memory test sequences. These test patterns are applied to the embedded memory array at cycle speed. Programmable ABIST, in contrast to finite-state machine ABIST allows for the application of a testing scheme that is flexible enough to help diagnose potential problems, stress memory array performance, and provide production-level testing ability.

Over time the memory arrays have become larger and faster and, therefore, consume more power than preceding generations of integrated circuits. When clocks are first applied to the memory arrays during the ABIST test sequence, there is a sudden large current draw from the integrated circuit power supply. Because the integrated circuit power supplies cannot respond with additional current for many microseconds, various levels of capacitors are used to supply the transient currents until the power supplies can respond. During this time, the integrated circuit power supply voltage will start to droop as the capacitors lose charge until the power supply can respond with the required current. The power supply voltage will continue to "ring" until a steady state DC current condition is achieved.

CMOS circuit speed is directly affected by power supply voltage. Circuits will run faster with higher voltage and slower with lower voltage. During the initial cycles of the ABIST test, the power supply will be fluctuating and the minimum cycle time for the ABIST test will vary with the power supply voltage. The performance of the memory arrays cannot be accurately measured during this time.

BRIEF SUMMARY OF THE INVENTION

An exemplary embodiment of the invention is a method and apparatus for delaying the start of an array built-in self-test (ABIST) until after the ABIST memory arrays have been started. The length of the delay is determined by the value in a programmable delay located on the integrated circuit. The initiation of the ABIST test is delayed by the time specified in the programmable delay.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

Figure 1:
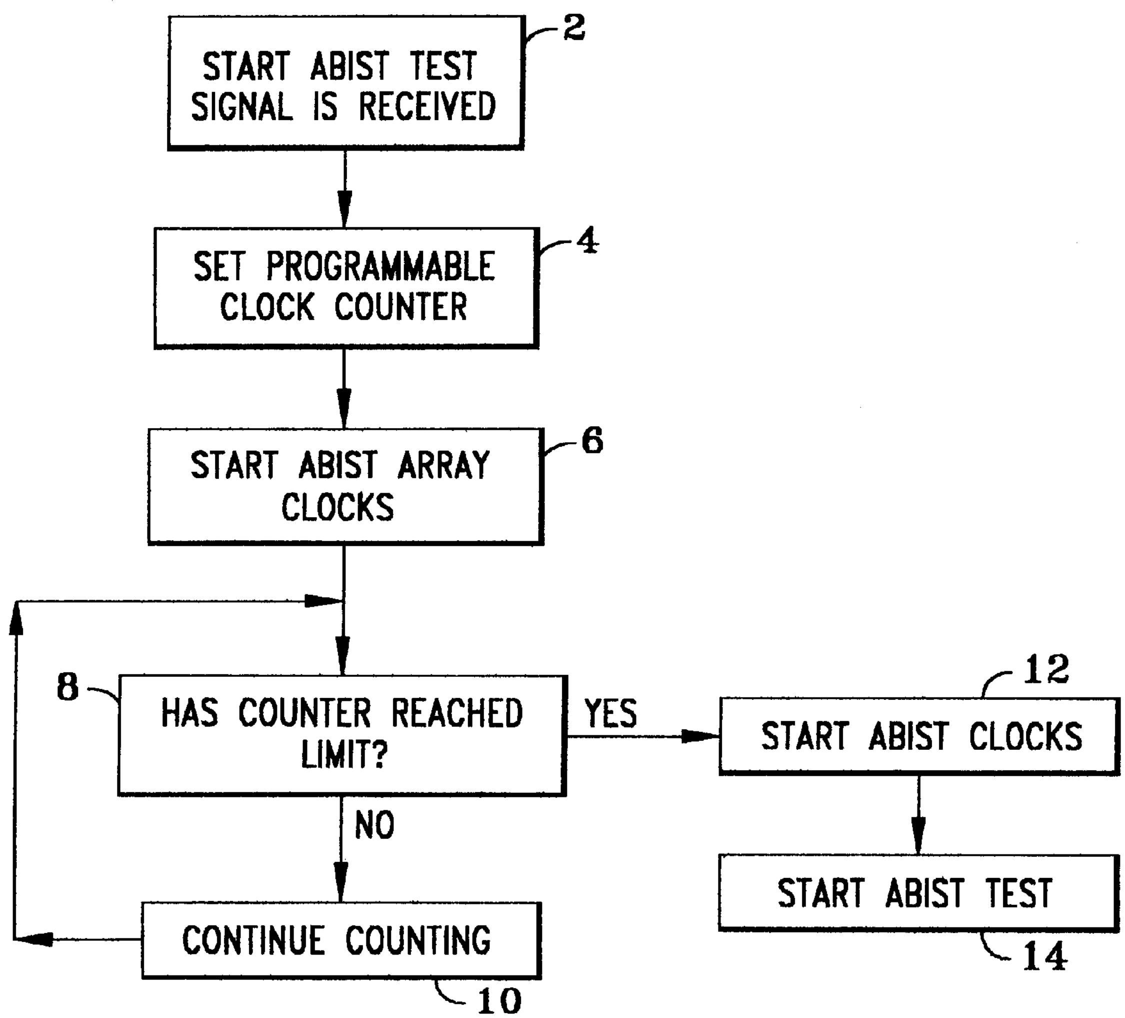
FIG. 1 depicts the overall flow of the programmable ABIST start delay.

FIG. 1 depicts the overall flow of the programmable ABIST start delay. A START_ABIST_TEST signal is received in step 2. In step 4, the programmable delay is set to a programmed limit that equals the length of the delay required between the start of the ABIST memory arrays and the start of the ABIST test. This value can be based on how long it will take for the power supply voltage on the integrated circuit to stabilize after the ABIST memory arrays have been started. Next, in step 6, the clocks for the ABIST memory arrays are started. Then, the programmable delay is checked to see if the programmable delay has reached a predetermined limit. For example, the programmable delay may count down to zero or count up to a stored value. If the programmable delay has not reached the predetermined limit, it continues running at step 10 and then step 8 is repeated. Once the programmable delay reaches the programmed limit, the ABIST clocks are started as shown in step 12. Last, in step 14 the ABIST test begins.

Figure 2:
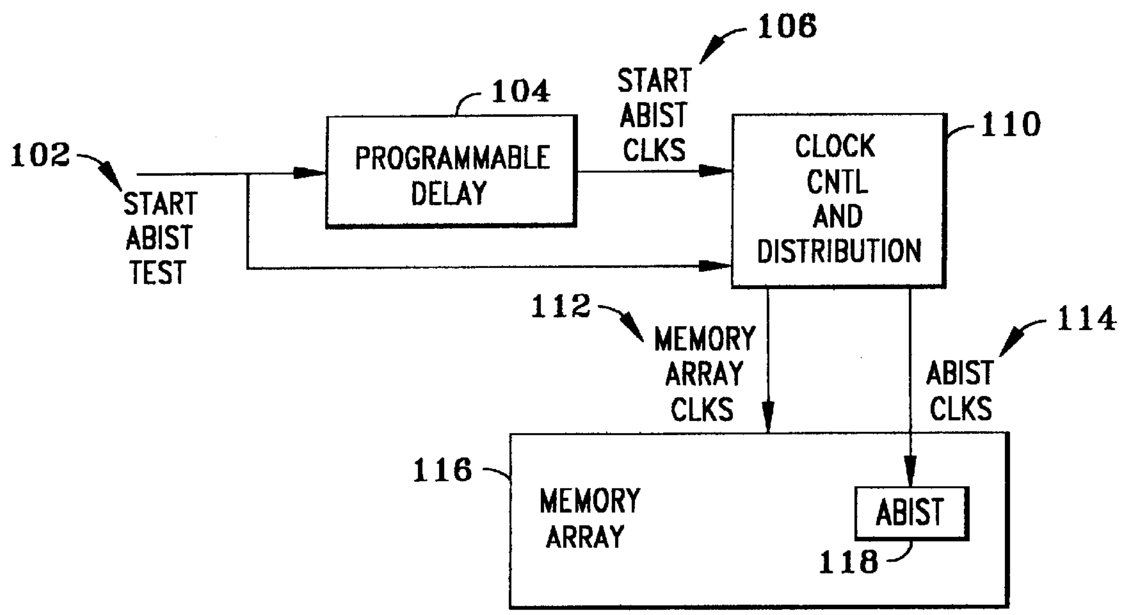
FIG. 2 depicts a hardware implementation of the programmable ABIST start delay.

FIG. 2 depicts a hardware implementation of the programmable ABIST start delay. A START_ABIST_TEST signal 102 is applied to initiate ABIST testing. This signal immediately instructs the clock controller 110 to generate a memory array clock signal 112. The clock controller 110 starts the memory array clocks so that the memory arrays 116 start burning power and drawing current. This START_ABIST_TEST signal 102 also starts a programmable delay

104 that has been programmed with the desired wait time (up to milliseconds) before starting ABIST testing. The programmable delay may be implemented by a counter, the value of which is compared to a programmed limit. Once the programmable delay 104 finishes (e.g., counts down to zero), the programmable delay 104 generates a start ABIST clocks signal 106. In response to the start ABIST clocks signal 106, the clock controller 110 provides an ABIST clock signal 114 to the ABIST circuitry 118 to start the ABIST tests. It should also be noted that this implementation is totally contained within the integrated circuit logic and requires no additional external test controls. The programmable delay 104 can be centrally located on the integrated circuit (i.e., accompanying the clock controller)and does not have to be replicated or instantiated with each of the many ABIST clock controllers potentially contained on the integrated circuit. This eliminates the need for the relatively small ABIST controllers each having to contain its own relatively large delay.

Figure 3:
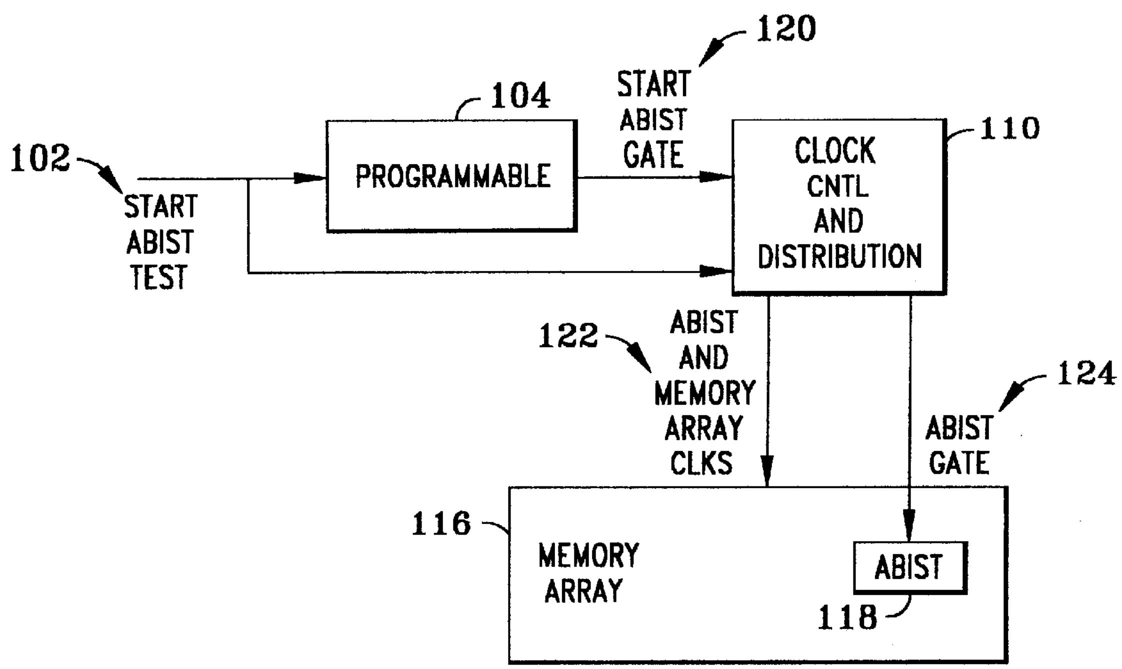
FIG. 3 depicts an alternate hardware embodiment of the programmable ABIST start delay.

FIG. 3 shows an alternate implementation where both the memory array and ABIST clocks are started at the same time through an ABIST and memory array clock signal 122, but start of the ABIST test is delayed. A START_ABIST_TEST signal 102 is applied to initiate ABIST testing. This signal is received by the clock controller 110 which generates the ABIST and memory array clock signal 122. The memory array 116 and the ABIST circuitry 118 receive the ABIST and memory array clock signal 122. In response to the clocks starting, the memory arrays 116 start burning power and drawing current. The start of the ABIST test is dependent on receiving an ABIST gate signal 124 from the clock controller 110 and therefore the ABIST does not start in response to the clocks starting. The START_ABIST_TEST signal 102 also starts the programmable delay 104 that has been programmed with the desired wait time (up to milliseconds). Once the programmable delay 104 reaches the programmed limit (e.g., counts down to 0), the programable delay 104 provides a start ABIST gate signal 120 to the clock controller 110. The clock controller 110 generates the ABIST gate signal 124 which is provided to ABIST circuitry 118 and the ABIST starts.

A benefit of delaying the start of the ABIST test until after the ABIST arrays have been initialized is that the test results will be more accurate. As discussed above the performance of the memory arrays cannot be accurately measured when the power supply is fluctuating. Using a programmable delay allows the counter to be set depending on the particular test environment.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An array built-in self test (ABIST) apparatus contained within an integrated circuit, said apparatus comprising:

a clock controller for generating a memory array clock for ABIST memory arrays, said clock controller located on said integrated circuit, said clock controller generating said memory array clock responsive to a start ABIST signal;

said clock controller generating an ABIST clock for ABIST circuitry, said clock controller generating said ABIST clock responsive to a start ABIST clock signal; and, a programmable delay located on said integrated circuit, said programmable delay receiving said start ABIST signal, delaying for a time period and generating said start ABIST clock signal such that said memory array clock is initiated prior to said ABIST clock.

2. The apparatus as recited in claim 1, wherein said programmable delay is utilized by a plurality of clock controllers.

3. The apparatus as recited in claim 1, wherein said programmable delay is located in said clock controller.

4. The apparatus recited in claim 1, wherein said ABIST is a finite-state machine ABIST.

5. The apparatus recited in claim 1, wherein said ABIST is a programmable ABIST.

6. A method of controlling the start-up of an ABIST test, said method comprising:

initiating a programable delay in response to a start ABIST test signal, wherein a value of said programmable delay is set programmably;

starting clocks to an ABIST memory array, wherein said starting of clocks is in response to said start ABIST test signal;

running said programmable delay until said value is reached;

generating a start ABIST clock signal in response to said programmable delay reaching said value;

starting an ABIST test, wherein starting said ABIST test is in response to said start ABIST clock signal, such that said clocks to said ABIST memory are initiated prior to starting said ABIST test.

* * * * *